(12) United States Patent
Lutze et al.

(10) Patent No.: US 6,975,537 B2
(45) Date of Patent: Dec. 13, 2005

(54) SOURCE SIDE SELF BOOSTING TECHNIQUE FOR NON-VOLATILE MEMORY

(75) Inventors: Jeffrey W. Lutze, San Jose, CA (US); Jian Chen, San Jose, CA (US); Yan Li, Milpitas, CA (US); Masaaki Higashitani, Cupertino, CA (US)

(73) Assignee: Sandisk Corporation, Sunnyvale, CA (US)

( * ) Notice: Subject to any disclaimer, the term of this patent is extended or adjusted under 35 U.S.C. 154(b) by 0 days.

(21) Appl. No.: 11/049,802

(22) Filed: Feb. 3, 2005

(65) Prior Publication Data

US 2005/0128810 A1 Jun. 16, 2005

Related U.S. Application Data

(63) Continuation of application No. 10/379,608, filed on Mar. 5, 2003, now Pat. No. 6,859,397.

(51) Int. Cl.[7] .............................................. G11C 16/04
(52) U.S. Cl. ........................... 365/185.18; 365/185.17; 365/196
(58) Field of Search ...................... 365/185.28, 185.17, 365/196, 185.18, 185.22, 185.24, 185.29, 365/185.03, 238.5, 195

(56) References Cited

U.S. PATENT DOCUMENTS

| | | | |
|---|---|---|---|
| 5,467,306 A | 11/1995 | Kaya et al. | |
| 5,677,873 A | 10/1997 | Choi et al. | |
| 5,715,194 A * | 2/1998 | Hu | 365/185.17 |
| 5,748,538 A * | 5/1998 | Lee et al. | 365/185.06 |
| 5,776,810 A | 7/1998 | Guterman et al. | |
| 5,867,429 A | 2/1999 | Chen et al. | |
| 5,973,962 A | 10/1999 | Kwon | |
| 5,986,929 A | 11/1999 | Sugiura et al. | |
| 5,991,202 A | 11/1999 | Derhacobian et al. | |
| 6,011,287 A | 1/2000 | Itoh et al. | |
| 6,028,788 A | 2/2000 | Choi et al. | |
| 6,046,935 A | 4/2000 | Takeuchi et al. | |
| 6,061,270 A * | 5/2000 | Choi | 365/185.02 |
| 6,108,238 A * | 8/2000 | Nakamura et al. | 365/185.22 |
| 6,134,157 A | 10/2000 | Takeuchi | |
| 6,228,782 B1 | 5/2001 | Fang et al. | |
| 6,307,807 B1 * | 10/2001 | Sakui et al. | 365/238.5 |

(Continued)

OTHER PUBLICATIONS

J.D. Choi, et al., "A Novel booster Plate Technology in High Density NAND Flash Memories for voltage Scaling-Down and Zero Program Disturbance," 1996 Symposium on VLSI Technology Digest of Technical Papers, pp. 238-239.

(Continued)

*Primary Examiner*—Gene N. Auduong
(74) *Attorney, Agent, or Firm*—Vierra Magen Marcus Harmon & DeNiro LLP

(57) ABSTRACT

A non-volatile semiconductor memory system (or other type of memory system) is programmed in a manner that avoids program disturb. In one embodiment that includes a flash memory system using a NAND architecture, program disturb is avoided by increasing the channel potential of the source side of the NAND string during the programming process. One exemplar implementation includes applying a voltage (e.g. Vdd) to the source contact and turning on the source side select transistor for the NAND sting corresponding to the cell being inhibited. Another implementation includes applying a pre-charging voltage to the unselected word lines of the NAND string corresponding to the cell being inhibited prior to applying the program voltage.

38 Claims, 13 Drawing Sheets

U.S. PATENT DOCUMENTS

| | | | |
|---|---|---|---|
| 6,353,555 B1 | 3/2002 | Jeong | |
| 6,363,010 B2 | 3/2002 | Tanaka et al. | |
| 6,411,551 B1 | 6/2002 | Kim et al. | |
| 6,456,528 B1 | 9/2002 | Chen | |
| 6,469,933 B2 * | 10/2002 | Choi et al. | 365/185.17 |
| 6,480,419 B2 | 11/2002 | Lee | |
| 6,493,265 B2 | 12/2002 | Satoh et al. | |
| 6,522,580 B2 * | 2/2003 | Chen et al. | 365/185.02 |
| 6,522,583 B2 * | 2/2003 | Kanda et al. | 365/185.17 |
| 6,614,688 B2 * | 9/2003 | Yeom et al. | 365/185.18 |
| 6,859,397 B2 * | 2/2005 | Lutze et al. | 365/185.28 |

OTHER PUBLICATIONS

Kang-Deog Suh, et al. "A 3.3V 32Mb NAND Flash Memory with Incremental Step Pulse Programming Scheme," pp. 128-129, 1995 IEEE International Solid State Circuits Conference.

Takeuchi, et al., "A Source-line Programming Scheme for Low voltage Operation NAND Flash Memories," 1988 Symposium on VLSI Circuits Digest of Technical Papers, pp. 37-38.

* cited by examiner

SOURCE SIDE SELF BOOSTING TECHNIQUE FOR NON-VOLATILE MEMORY

This application is a continuation application of U.S. patent application Ser. No. 10/379,608, entitled "SOURCE SIDE SELF BOOSTING TECHNIQUE FOR NON-VOLATILE MEMORY," filed Mar. 5, 2003, now U.S. Pat. No. 6,859,397, issued Feb. 22, 2005, incorporated herein by reference in its entirety.

BACKGROUND OF THE INVENTION

1. Field of the Invention

The present invention relates generally to technology for programming memory devices. In one embodiment, the present invention is directed to the programming of a non-volatile memory (e.g. a flash memory device) using a self boosting technique.

2. Description of the Related Art

Semiconductor memory devices have become more popular for use in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

One example of a flash memory system uses the NAND structure, which includes arranging multiple transistors in series, sandwiched between two select gates. The transistors in series and the select gates are referred to as a NAND string. FIG. 1 is a top view showing one NAND string. FIG. 2 is an equivalent circuit thereof. The NAND string depicted in FIGS. 1 and 2 includes four transistors 100, 102, 104 and 106 in series and sandwiched between a first select gate 120 and a second select gate 122. Select gate 120 connects the NAND string to bit line 126. Select gate 122 connects the NAND string to source line 128. Select gate 120 is controlled by the applying appropriate voltages to control gate 120CG for select gate 120. Select gate 122 is controlled by applying the appropriate voltages to control gate 122CG of select gate 122. Each of the transistors 100, 102, 104 and 106 has a control gate and a floating gate. For example, transistor 100 has control gate 100CG and floating gate 100FG. Transistor 102 includes control gate 102CG and a floating gate 102FG. Transistor 104 includes control gate 104CG and floating gate 104FG. Transistor 106 includes a control gate 106CG and a floating gate 106FG. Control gate 100CG is connected to word line WL3, control gate 102CG is connected to word line WL2, control gate 104CG is connected to word line WL1, and control gate 106CG is connected to word line WL0.

FIG. 3 provides a cross-sectional view of the NAND string described above. As depicted in FIG. 3, the transistors (also called cells or memory cells) of the NAND string are formed in p-well region 140. Each transistor includes a stacked gate structure that consists of the control gate (100CG, 102CG, 104CG and 106CG) and a floating gate (100FG, 102FG, 104FG and 106FG). The floating gates are formed on the surface of the p-well on top of an oxide film. The control gate is above the floating gate, with an oxide layer separating the control gate and floating gate. Note that FIG. 3 appears to depict a control gate and floating gate for transistors 120 and 122. However, for transistors 120 and 122, the control gate and the floating gate are connected together. The control gates of the memory cells (100, 102, 104, 106) form the word lines. N+ diffused layers 130, 132, 134, 136 and 138 are shared between neighboring cells whereby the cells are connected to one another in series to form a NAND string. These N+ diffused layers form the source and drain of each of the cells. For example, N+ diffused layer 130 serves as the drain of transistor 122 and the source for transistor of 106, N+ diffused layer 132 serves as the drain for transistor 106 and the source for transistor 104, N+ diffused region 134 serves as the drain for transistor 104 and the source for transistor 102, N+ diffused region 136 serves as the drain for transistor 102 and the source for transistor 100, and N+ diffused layer 138 serves as the drain for transistor 100 and the source for transistor 120. N+ diffused layer 126 connects to the bit line for the NAND string, while N+ diffused layer 128 connects to a common source line for multiple NAND strings.

Note that although FIGS. 1–3 shows four memory cells in the NAND string, the use of four transistors is only provided as an example. A NAND string can have less than four memory cells or more than four memory cells. For example, some NAND strings will include eight memory cells, 16 memory cells, 32 memory cells, etc. The discussion herein is not limited to any particular number of memory cells in a NAND string.

A typical architecture for a flash memory system using a NAND structure will include several NAND strings. For example, FIG. 4 shows three NAND strings 202, 204 and 206 of a memory array having many more NAND strings. Each of the NAND strings of FIG. 4 includes two select transistors and four memory cells. For example, NAND string 202 includes select transistors 220 and 230, and memory cells 220, 224, 226 and 228. NAND string 204 includes select transistors 240 and 250, and memory cells 242, 244, 246 and 248. Each string is connected to the source line by its select transistor (e.g. select transistor 230 and select transistor 250). A selection line SGS is used to control the source side select gates. The various NAND strings are connected to respective bit lines by select transistors 220, 240, etc., which are controlled by select line SGD. In other embodiments, the select lines do not necessarily need to be in common. Word line WL2 is connected to the control gates for memory cell 222 and memory cell 242. Word line WL3 is connected to the control gates for memory cell 224 and memory cell 244. Word line WL1 is connected to the control gates for memory cell 226 and memory cell 246. Word line WL0 is connected to the control gates for memory cell 228 and memory cell 248. As can be seen, each bit line and the respective NAND string comprise the columns of the array of memory cells. The word lines (WL3, WL2, WL1 and WL0) comprise the rows of the array. Each word line connects the control gates of each memory cell in the row. For example, word line WL2 is connected to the control gates for memory cells 224, 244 and 250.

Each memory cell can store data (analog or digital). When storing one bit of digital data, the range of possible threshold voltages of the memory cell is divided into two ranges which are assigned logical data "1" and "0." In one example of a NAND type flash memory, the voltage threshold is negative after the memory cell is erased, and defined as logic "1." The threshold voltage after a program operation is positive and defined as logic "0." When the threshold voltage is negative and a read is attempted, the memory cell will turn on to indicate logic one is being stored. When the threshold voltage is positive and a read operation is attempted, the memory cell will not turn on, which indicates that logic zero is stored. A memory cell can also store multiple levels of information, for example, multiple bits of digital data. In the case of storing multiple levels of data, the range of possible threshold voltages is divided into the number of levels of data. For example, if four levels of information is stored, there will be four threshold voltage ranges assigned to the data values "11", "10", "01", and "00." In one example of a NAND type memory, the threshold voltage after an erase operation is negative and defined as "11". Positive threshold voltages are used for the states of "10", "01", and "00."

Relevant examples of NAND type flash memories and their operation are provided in the following U.S. Patents/Patent Applications, all of which are incorporated herein by reference: U.S. Pat. Nos. 5,570,315; 5,774,397, 6,046,935, 6,456,528 and U.S. patent application. Ser. No. 09/893,277 (Publication No. US2003/0002348).

When programming a flash memory cell, a program voltage is applied to the control gate and the bit line is grounded. Electrons from the p-well are injected into the floating gate. When electrons accumulate in the floating gate, the floating gate becomes negatively charged and the threshold voltage of the cell is raised. To apply the program voltage to the control gate of the cell being programmed, that program voltage is applied on the appropriate word line. As discussed above, that word line is also connected to one cell in each of the other NAND strings that utilize the same word line. For example, when programming cell 224 of FIG. 4, the program voltage will also be applied to the control gate of cell 244 because both cells share the same word line. A problem arises when it's desired to program one cell on a word line without programming other cells connected to the same word line, for example, when it's desired to program cell 224 and not cell 244. Because the program voltage is applied to all cells connected to a word line an unselected cell (a cell that is not to be programmed) on the word line, especially a cell adjacent to the cell selected for programming, may become inadvertently programmed. For example, cell 244 is adjacent to cell 224. When programming cell 224, there is a concern that cell 244 might unintentionally be programmed. The unintentional programming of the unselected cell on the selected word line is referred to as "program disturb."

Several techniques can be employed to prevent program disturbed. In one method known as "self boosting," the unselected bit lines are electrically isolated and a pass voltage (e.g. 10 volts) is applied to the unselected word lines during programming. The unselected word lines couple to the unselected bit lines, causing a voltage (e.g. eight volts) to exist in the channel of the unselected bit lines, which tends to reduce program disturb. Self boosting causes a voltage boost to exist in the channel which tends to lower the voltage across the tunnel oxide and hence reduce program disturb.

A NAND string is typically (but not always) programmed from the source side to the drain side, for example, from memory cell 228 to memory cell 220. When the programming process is ready to program the last (or near the last) memory cell of the NAND string, if all or most of the previously programmed cells on the string being inhibited (e.g. string 204) were programmed, then there is negative charge in the floating gates of the previously programmed cells. Because of this negative charge on the floating gates, the boosting potential doesn't get high enough and there still may be program disturb on the last few word lines. For example, when programming cell 222, if cells 248, 246 and 244 were programmed, then each of those transistors (244, 246, 248) have a negative charge on their floating gate which will limit the boosting level of the self boosting process and possibly cause program disturb on cell 242.

The problem discussed above with self boosting has been addressed by two other schemes: Local Self Boosting ("LSB") and Erased Area Self Boosting ("EASB"). Both LSB and EASB attempt to isolate the channel of previously programmed cells from the channel of the cell being inhibited. For example, if cell 224 of FIG. 4 is being programmed, LSB and EASB attempt to inhibit programming in cell 244 by isolating the channel of cell 244 from the previously programmed cells (246 and 248). With the LSB technique, the bit line for the cell being programmed is at ground and the bit line of the string with the cell being inhibited is at Vdd. The program voltage Vpgm (e.g. 20 volts) is driven on the selected word line. The word lines neighboring the selected word line are at zero volts and the remaining non-selected word lines are at Vpass. For example, looking at FIG. 4, bit line 202 is at zero volts and bit line 204 is at Vdd. Drain select SCD is at Vdd and source select SGS is at zero volts. Selected word line WL2 (for programming cell 224) is at Vpgm. Neighboring word lines WL1 and WL3 are at zero volts, and other word lines (e.g. WL0 ) are at Vpass.

EASB is similar to LSB with the exception that only the source side neighbor word line is at zero volts. For example, WL1 would be at zero volts while WL3 would be at Vpass. In one embodiment, Vpass is 7–10 volts. If Vpass is too low, boosting in the channel is insufficient to prevent program disturb. If Vpass is too high, unselected word lines will be programmed.

While LSB and EASB provide an improvement over self boosting, they also present a problem that depends on whether the source side neighbor cell (cell 246 is the source side neighbor of cell 244) is programmed or erased. If the source side neighbor cell is programmed, then there is a negative charge on the floating gate of that source side neighbor cell. Zero volts are applied to the control gate. Thus, there is a highly reverse biased junction under the negatively charged gate which can cause Gate Induced Drain Leakage (GIDL). GIDL involves electrons leaking into the boosted channel. GIDL occurs with a large bias in the junction and a low or negative gate voltage, which is precisely the case when the source side neighbor cell is programmed and the drain junction is boosted. GIDL will cause the boosted voltage to leak away prematurely, resulting in a programming error. GIDL is more severe with the abruptly and highly doped junctions, which are required as cell dimensions are scaled. If the leakage current is high enough, the boosting potential in the channel region will go down and there can be program disturb. The closer the word line being programmed is to the drain, the less charge is present in the boosted junction. Thus, the voltage in the boosted junction will drop quickly, causing program disturb.

If the source side neighbor memory cell is erased, then there is positive charge on the floating gate and the threshold voltage of the transistor will likely be negative. The transistor may not turn off even when zero volts is applied to the word line. If the memory cell is on, then the NAND string is not operating in EASB mode. Rather that string is operating in self boosting mode, and self boosting mode has the problems discussed above. This scenario is most likely if other source side cells are programmed, which limits source side boosting. This issue is most problematic with shorter channel lengths.

Thus, there is a need for a better mechanism to prevent program disturb.

SUMMARY OF THE INVENTION

The present invention, roughly described, pertains to technology for programming memory devices in a manner that avoids program disturb. One embodiment includes the programming of a memory system that comprises a set of NAND flash memory strings by increasing the channel potential of the source side of the NAND string in order to improve self boosting performance and minimize program disturb. If the source side neighbor is programmed, then raising the voltage potential of the source side channel of the NAND string reduces GIDL. If the source side neighbor is erased, then raising the voltage potential of the source side channel of the NAND string helps keep the source side neighbor cell from turning on.

One implementation of the present invention includes boosting a voltage potential of a source side channel region of a set of storage elements, where the set of storage elements include a storage element to be inhibited. A program voltage is applied to a storage element selected for programming and to the storage element to be inhibited. A pass voltage is applied to at least a subset of the storage elements, in addition to the boosting mentioned above. In one embodiment, the storage element selected for programming is a flash memory cell that is part of a first string of NAND cells and the storage element to be inhibited is a flash memory cell that is part of a second string of NAND cells; the storage element selected for programming and the storage element to be inhibited are both connected to a first word line; additional word lines connect to other flash memory cells of the first string of NAND cells and the second string of NAND cells; the additional word lines include a source side neighbor word line and other source side word lines; the step of boosting includes applying a pre-charging voltage to the source side neighbor word line and one or more of the other source side word lines; and the step of applying a pre-charging voltage is commenced prior to the step of applying a pass voltage. In another embodiment, the step of boosting includes applying a first pre-charging voltage to a source line corresponding to the second NAND string and electrically coupling the source line to the second NAND string.

One embodiment of an apparatus according the present invention comprises a first set of storage elements that includes a storage element to be programmed and a second set of storage elements that includes a storage element to be inhibited. In one example, the first set of storage elements is a first NAND string of flash memory cells and the second set of storage elements is a second NAND string of flash memory cells. The second set of storage elements is capable of having a source side channel region with a voltage potential that is boosted in addition to the self boosting from driving a pass voltage on the word lines. The apparatus comprises a plurality of word lines. A first word line is connected to the storage element to be programmed and to the storage element to be inhibited in order to apply a program voltage during the program operation. Other word lines receive a pass voltage to raise the voltage potential of the source side channel region during the programming operation in addition to the boosted voltage potential mentioned above.

These and other objects and advantages of the present invention will appear more clearly from the following description in which the preferred embodiment of the invention has been set forth in conjunction with the drawings.

DETAILED DESCRIPTION

Figure 5:
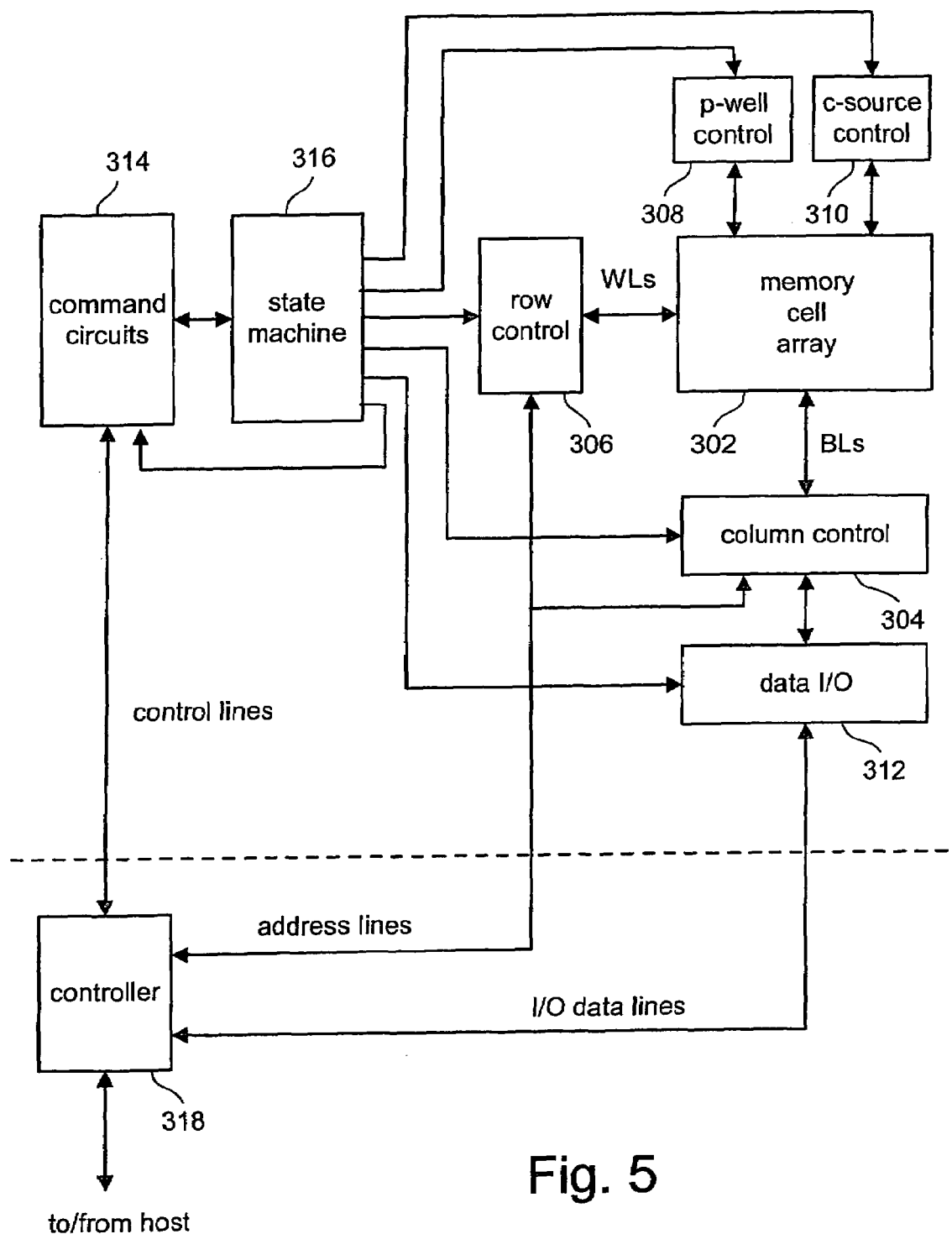
FIG. 5 is a block diagram of one embodiment of a non-volatile memory system in which the various aspects of the present invention are implemented.

FIG. 5 is a block diagram of one embodiment of a flash memory system that can be used to implement the present invention. Memory cell array 302 is controlled by column control circuit 304, row control circuit 306, c-source control circuit 310 and p-well control circuit 308. Column control circuit 304 is connected to the bit lines of memory cell array 302 for reading data stored in the memory cells, for determining a state of the memory cells during a program operation, and for controlling potential levels of the bit lines to promote the programming or to inhibit the programming. Row control circuit 306 is connected to the word lines to select one of the word lines, to apply read voltages, to apply a program voltages combined with the bit line potential levels controlled by column control circuit 304, and to apply an erase voltage. C-source control circuit 310 controls a common source line (labeled as "C-source" in FIG. 6) connected to the memory cells. P-well control circuit 308 controls the p-well voltage.

The data stored in the memory cells are read out by the column control circuit 304 and are output to external I/O lines via data input/output buffer 312. Program data to be stored in the memory cells are input to the data input/output buffer 312 via the external I/O lines, and transferred to the column control circuit 304. The external I/O lines are connected to controller 318.

Command data for controlling the flash memory device are input to controller 318. The command data informs the flash memory of what operation is requested. The input command is transferred to state machine 316 that controls column control circuit 304, row control circuit 306, c-source control 310, p-well control circuit 308 and data input/output buffer 312. State machine 316 can also output status data of the flash memory such as READY/BUSY or PASS/FAIL.

Controller 318 is connected or connectable with a host system such as a personal computer, a digital camera, or personal digital assistant, etc. It communicates with the host that initiates commands, such as to store or read data to or from the memory array 302, and provides or receives such data. Controller 318 converts such commands into command signals that can be interpreted and executed by command circuits 314, which is in communication with state machine 316. Controller 318 typically contains buffer memory for the user data being written to or read from the memory array.

One exemplar memory system comprises one integrated circuit that includes controller 318, and one or more integrated circuit chips that each contain a memory array and associated control, input/output and state machine circuits. The trend, of course, is to integrate the memory arrays and controller circuits of a system together on one or more integrated circuit chips. The memory system may be embedded as part of the host system, or may be included in a memory card (or other package) that is removably inserted into the host systems. Such a card may include the entire memory system (e.g. including the controller) or just the memory array(s) with associated peripheral circuits (with the Controller being embedded in the host). Thus, the controller can be embedded in the host or included within a removable memory system.

Figure 6:
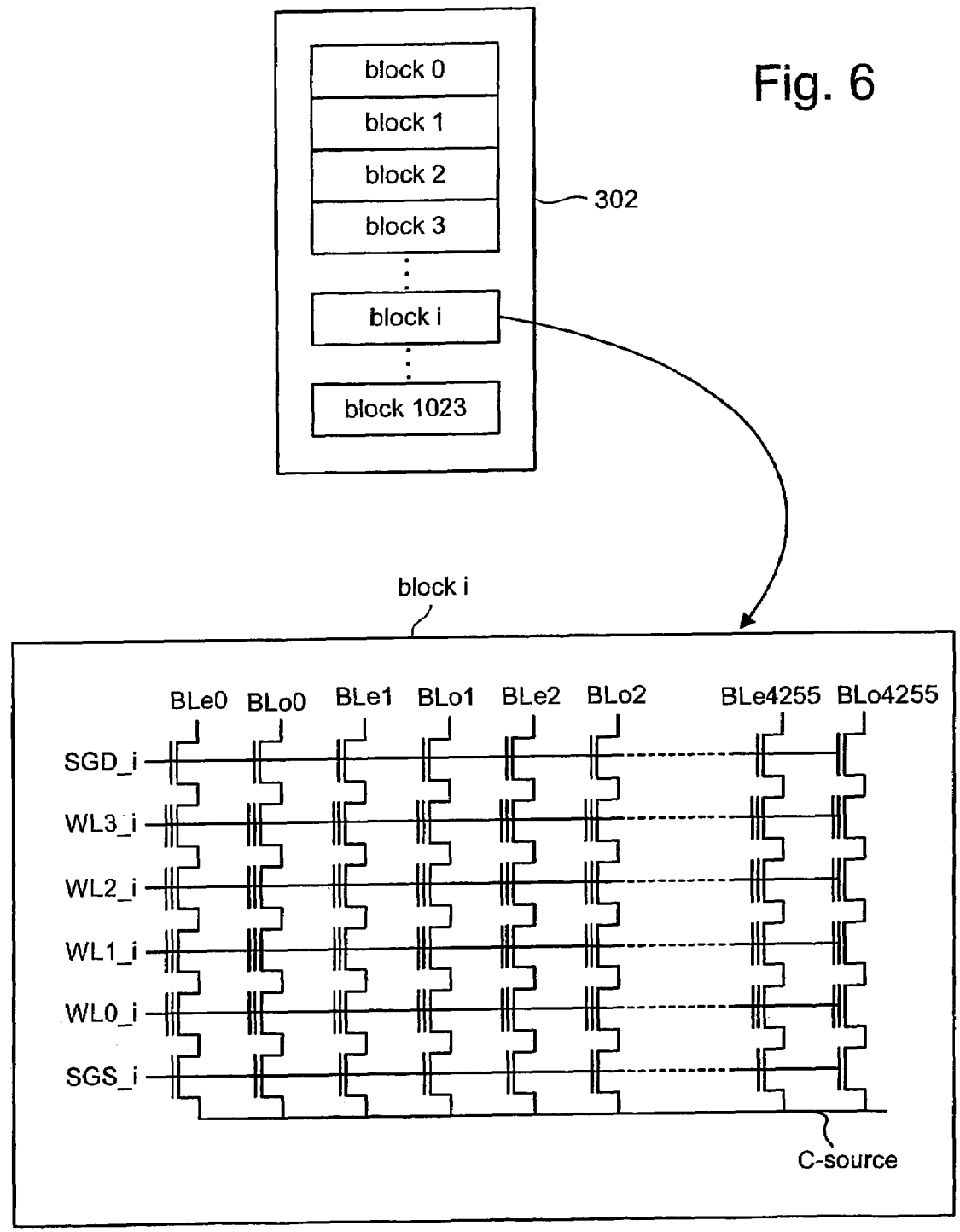
FIG. 6 illustrates an example of an organization of a memory array.

With reference to FIG. 6, an example structure of memory cell array 302 is described. As one example, a NAND flash EEPROM is described that is partitioned into 1,024 blocks. The data stored in each block is simultaneously erased. In one embodiment, the block is the minimum unit of cells that are simultaneously erased. In each block, in this example, there are 8,512 columns that are divided into even columns and odd columns. The bit lines are also divided into even bit lines (BLe) and odd bit lines (BLo). FIG. 6 shows four memory cells connected in series to form a NAND string. Although four cells are shown to be included in each NAND string, more or less than four can be used. One terminal of the NAND string is connected to corresponding bit line via a first select transistor SGD, and another terminal is connected to c-source via a second select transistor SGS.

During read and programming operations, 4,256 memory cells are simultaneously selected. The memory cells selected have the same word line (e.g. WL2-i), and the same kind of bit line (e.g. even bit lines). Therefore, 532 bytes of data can be read or programmed simultaneously. These 532 bytes of data that are simultaneously read or programmed form a logical page. Therefore, one block can store at least eight pages. When each memory cell stores two bits of data (e.g. a multi-level cell), one block stores 16 pages.

Memory cells are erased by raising the p-well to an erase voltage (e.g. 20 volts) and grounding the word lines of a selected block. The source and bit lines are floating. Erasing can be performed on the entire memory array, separate blocks, or another unit of cells. Electrons are transferred from the floating gate to the p-well region and the threshold voltage becomes negative.

In the read and verify operations, the select gates (SGD and SGS) and the unselected word lines (e.g., WL0, WL1 and WL3) are raised to a read pass voltage (e.g. 4.5 volts) to make the transistors operate as pass gates. The selected word line (e.g. WL2) is connected to a voltage, a level of which is specified for each read and verify operation in order to determine whether a threshold voltage of the concerned memory cell has reached such level. For example, in a read operation, the selected word line WL2 is grounded, so that it is detected whether the threshold voltage is higher than 0V. In a verify operation, the selected word line WL2 is connected to 2.4V, for example, so that it is verified whether the threshold voltage has reached 2.4V or another threshold level. The source and p-well are at zero volts. The selected bit lines (BLe) are pre-charged to a level of, for example, 0.7V. If the threshold voltage is higher than the read or verify level, the potential level of the concerned bit line (BLe) maintains the high level, because of the non-conductive memory cell. On the other hand, if the threshold voltage is lower than the read or verify level, the potential level of the concerned bit line (BLe) decreases to a low level, for example less than 0.5V, because of the conductive memory cell (M). The state of the memory cell is detected by a sense amplifier that is connected to the bit line. The difference between whether the memory cell is erased or programmed depends on whether or not negative charge is stored in the floating gate. For example, if negative charge is stored in the floating gate, the threshold voltage becomes higher and the transistor can be in enhancement mode.

The erase, read and verify operations described above are performed according to techniques known in the art. Thus, many of the details explained can be varied by one skilled in the art.

Figure 7:
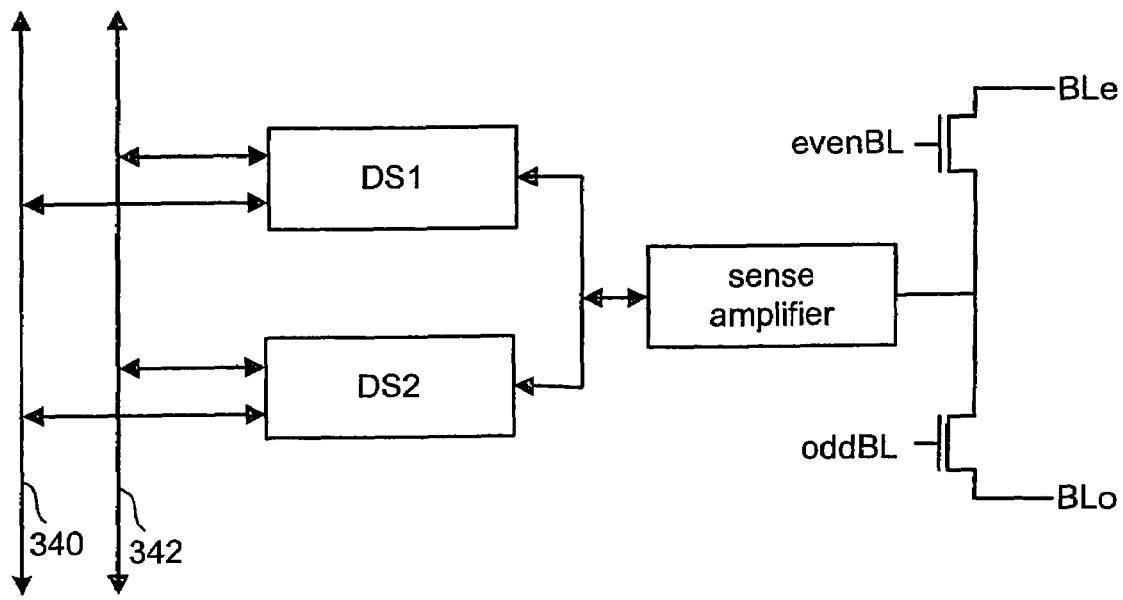
FIG. 7 depicts a portion of the column control circuit.

FIG. 7 depicts a portion of column control circuit 304 of FIG. 5. Each pair of bit lines (BLe and BLo) is coupled to a sense amplifier. The sense amplifier is connected to two data storage registers DS1 and DS2, each being capable of storing one bit of data. The sense amplifier senses the potential level of the selected bit line during read or verify operations and then stores the data in a binary manner, and controls the bit line voltage in the program operation. The sense amplifier is selectively connected to the selected bit line by selecting one of signals of "evenBL" and "oddBL." Both of the data storage registers DS1 and DS2 are coupled to I/O lines 340 to output read data and to store program data. I/O lines 340 are connected to data input/output buffer 312 of FIG. 5. Both of the data storage registers DS1 and DS2 are coupled to status line(s) 342 to receive and send status information. In one embodiment, there is a sense amplifier and a pair of data storage registers DS1 and DS2 for each pair of bit lines.

Figure 8:
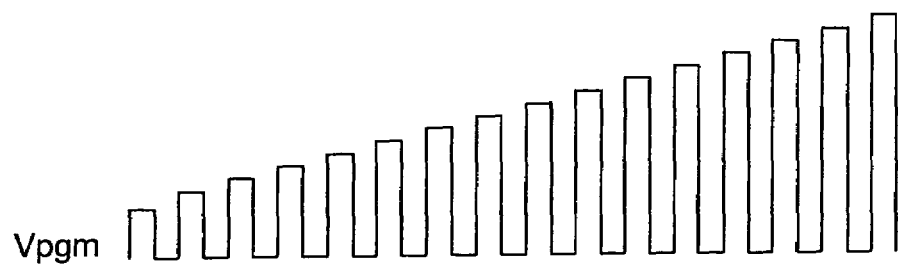
FIG. 8 depicts an example of a program voltage signal.

FIG. 8 depicts a programming pulse waveform. The programming voltage Vpgm is divided into many pulses. The magnitude of the pulses is increased with each pulse by a predetermined step size. In one embodiment that includes the memory cells storing one bit of data, an example of a step size is 0.8 volts. In one embodiment that includes the memory cells storing multiple bits of data, an example of a step size is 0.2 volts. One example of a starting level of Vpgm is 12V. When attempting to inhibit a cell from being programmed, the pass voltage (Vpass) is also applied as a series of pulses with an increasing magnitude. An example of a step size for Vpass is 0.56 volts. In some embodiments that include the memory cells storing multiple bits of data, Vpass may have an amplitude that does not step up.

In the periods between the pulses, verify operations are carried out. That is, the programmed level of each cell being programmed in parallel is read between each programming pulse to determine whether it is equal to or greater than the verify level to which it is being programmed. For example, if the threshold voltage is being raised to 2.5 volts, then the verify process will determine whether the threshold voltage is at least 2.5 volts. If it is determined that the threshold voltage of a given memory cell has exceeded the verify level, Vpgm is removed for that cell by raising the voltage of the bit line of the NAND string for the cell from 0V to Vdd. Programming of other cells being programmed in parallel continues until they in turn reach their verify levels.

Figure 9:
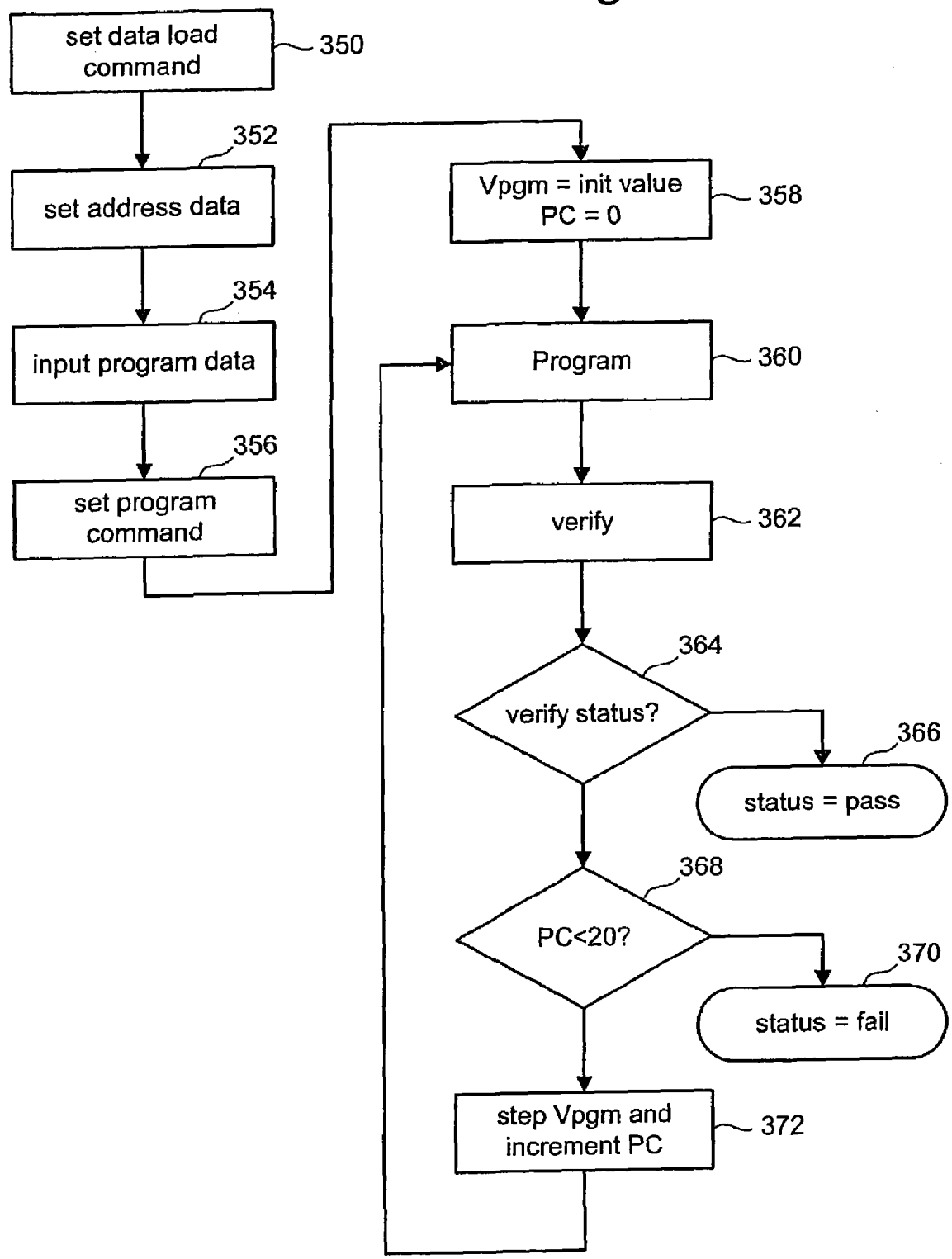
FIG. 9 is a flow chart describing one embodiment of a programming process.

FIG. 9 is a flow chart describing one embodiment of a method for programming a memory. In one implementation, memory cells are erased (in blocks or other units) prior to programming. In step 350 of FIG. 9, a "data load" command is issued by controller 318 and input to data input/output buffer 312. The input data is recognized as a command and latched by state machine 316 because a command latch signal (not illustrated) is input to command circuits 314. In step 352, address data designating the page address is input to data input/output buffer 3112 from controller 318. The input data is recognized as the page address and latched by state machine 316 because the address latch signal is input to command circuits 314. In step 354, 532 bytes of program data are input to data input/output buffer 312. That data is latched in the DS1 registers for the selected bit lines. In some embodiments, the data is also latched in the DS2 registers for the selected bit lines to use for verify operations. In step 356, a "program" command is issued by controller 318 and input to data input/output buffer 312. The command is latched by state machine 316 because the command latch signal is input to command circuits 314.

Triggered by the "program" command, the data latched in the DS1 data storage registers will be programmed into the selected memory cells controlled by state machine 316 using the stepped pulses of FIG. 8. In step 358, Vpgm is initialized to the starting pulse (e.g., 12V) and a program counter PC maintained by state machine 316 is initialized at 0. In step 360, the first Vpgm pulse is applied to the selected word line, for example WL2 of FIG. 4 or WL-3 of FIG. 13. If logic "0" is stored in a particular data storage register DS1, then the corresponding bit line is grounded. On the other hand, if logic "1" is stored in the data storage register DS1, then the corresponding bit line is connected to Vdd to inhibit programming. More details of step 360 will be provided below.

In step 362, the states of the selected memory cells are verified. If it is detected that the target threshold voltage of a selected cell has reached the appropriate level (e.g. the programmed level for logic "0" or a particular state of a multi-state cell), then the data stored in DS1 is changed to a logic "1." If it is detected that the threshold voltage has not reached the appropriate level, the data stored in DS1 is not changed. In this manner, a bit line having a logic "1" stored in its corresponding data storage register DS1 does not need to be programmed. When all of the data storage registers DS1 are storing logic "1,"the state machine (via flag 342) knows that all selected cells have been programmed. In step 364, it is checked whether all of the data storage registers DS1 are storing logic "1."If so, the programming process is complete and successful because all selected memory cells were programmed and verified. A status of "PASS" is reported in step 366.

If, in step 364, it is determined that not all of the data storage registers DS1 are storing logic "1," then the programming process continues. In step 368, the program counter PC is checked against a program limit value. On example of a program limit value is 20. If the program counter PC is not less than 20, then the program process has failed and a status of "FAIL" is reported in step 370. If the program counter PC is less than 20, then the Vpgm level is increased by the step size and the program counter PC is incremented in step 372. After step 372, the process loops back to step 360 to apply the next Vpgm pulse.

Figure 10:
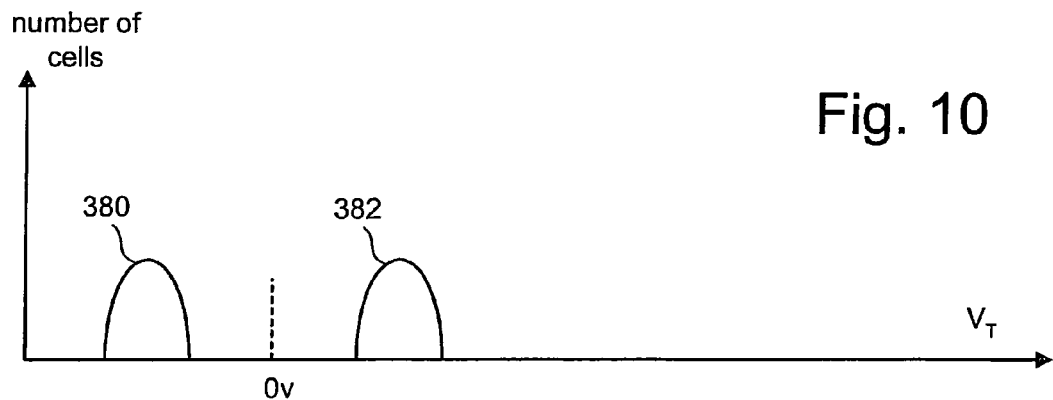
FIG. 10 depicts example memory cell threshold distributions for memory cells that store two states.

At the end of a successful program process, the threshold voltages of the memory cells should be within one or more distributions of threshold voltages for programmed memory cells or within a distribution of threshold voltages for erased memory cells. FIG. 10 illustrates threshold voltage distributions for the memory cell array when each memory cell stores one bit of data. FIG. 10 shows a first distribution 380 of threshold voltages for erased memory cells and a second distribution 382 of threshold voltages for programmed memory cells. In one embodiment, the threshold voltages in the first distribution are negative and the threshold voltages in the second distribution are positive.

Figure 11:
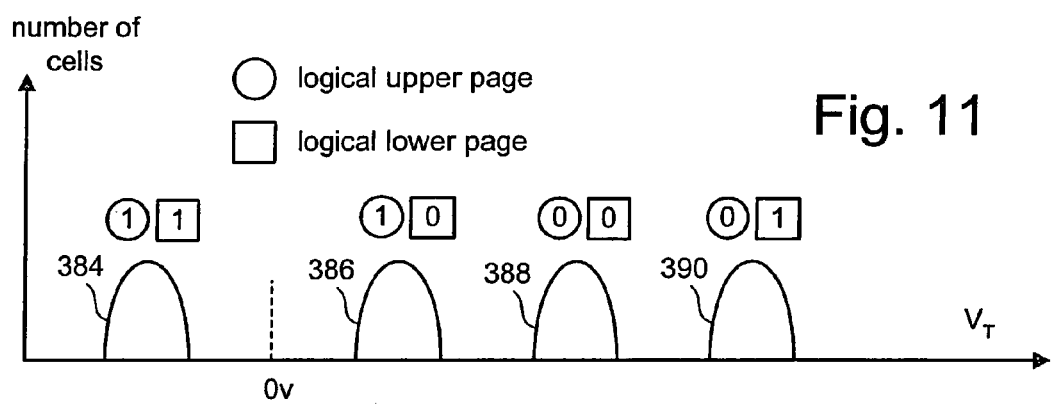
FIG. 11 depicts example memory cell threshold distributions for memory cells that store four states.

FIG. 11 illustrates threshold voltage distributions for memory cells storing two bits of data (e.g. four data states). Distribution 384 represents a distribution of threshold voltages of cells that are in the erased state (storing "11"), having negative threshold voltage levels. Distribution 386 represents a distribution of threshold voltages of cells that are storing "10." Distribution 388 represents a distribution of threshold voltages of cells that are storing "00." Distribution 390 represents a distribution of threshold voltages of cells that are storing "01." Each of the two bits stored in a single memory cell, in this example, is from a different logical page. That is, each bit of the two bits stored in each memory cell carries a different logical page address. The bit displayed in the square corresponds to a lower page. The bit displayed in the circle corresponds to an upper page. In order to provide improved reliability, it is better for the individual distributions to be tightened (distribution narrowed), because the tighter distribution brings a wider read margin (distance between them).

According to the article "Fast and Accurate Programming Method for Multi-level NAND EEPROMs, pp129–130, Digest of 1995 Symposium on VLSI Technology," which article is incorporated herein by this reference, in principle, limiting a distribution to a 0.2V-width requires that the usual repetitive programming pulses be incremented 0.2V between steps. To tighten the distribution within a 0.05V-width, a 0.05V step is required. Programming cells with such small step increments in programming voltage results in increasing the programming time.

Figure 12:
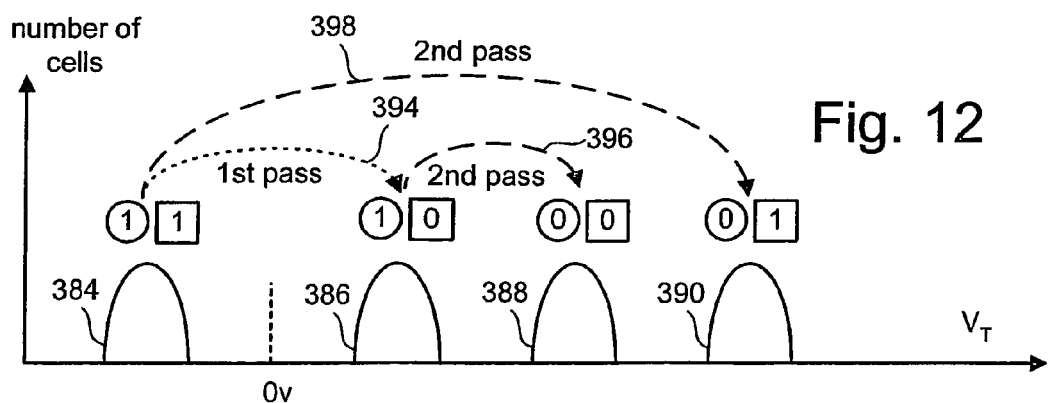
FIG. 12 depicts memory cell threshold distributions and illustrates one example of a technique for programming multi-state memory cells.

FIG. 12 illustrates an example of a two pass technique of programming a 4-state NAND memory cell. In a first programming pass, the cell's threshold voltage level is set according to the bit to be programmed into the lower logical page. If that bit is a logic "1," the threshold voltage is not changed since it is in the appropriate state as a result of having been earlier erased. However, if the bit to be programmed is a logic "0," the threshold level of the cell is increased to be within threshold voltage distribution 386, as shown by arrow 394. That concludes the first programming pass.

In a second programming pass, the cell's threshold voltage level is set according to the bit being programmed into the upper logical page. If the upper logical page bit is to store a logic "1," then no programming occurs since the cell is in one of the states corresponding to threshold voltage distributions 384 or 386, depending upon the programming of the lower page bit, both of which carry an upper page bit of "1." If the upper page bit is to be a logic "0," however, the cell is programmed a second time. If the first pass resulted in the cell remaining in the erased state corresponding to threshold distribution 384, then in the second phase the cell is programmed so that the threshold voltage is increase to be within threshold distribution 390, as shown by arrow 398. If the cell had been programmed into the state corresponding to threshold distribution 386 as a result of the first programming pass, then the memory cell is further programmed in the second pass so that the threshold voltage is increase to be within threshold voltage distribution 388, as depicted by arrow 396. The result of the second pass is to program the cell into the state designated to store a logic "0" for the upper page without changing the result of the first pass programming.

Of course, if the memory is operated with more than four states then there will be a number of threshold voltage distributions within the defined voltage threshold window of the memory cells that is equal to the number of states. Further, although specific bit patterns have been assigned to each of the distributions, different bit patterns may be so assigned, in which case the states between which programming occurs can be different than those depicted in FIGS. 10–12.

Figure 1:
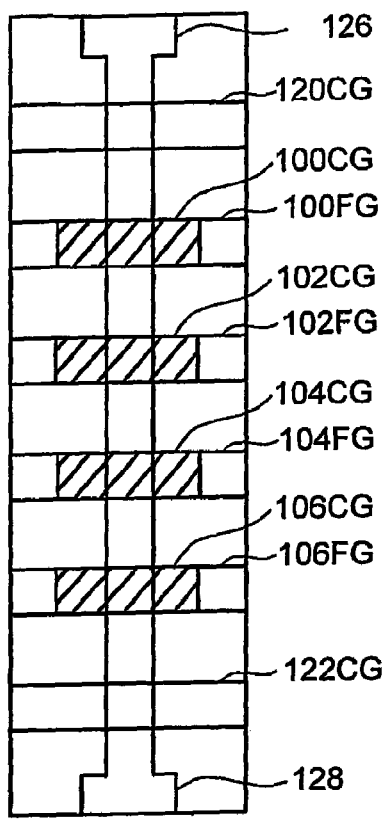
FIG. 1 is a top view of a NAND string.
Figure 2:
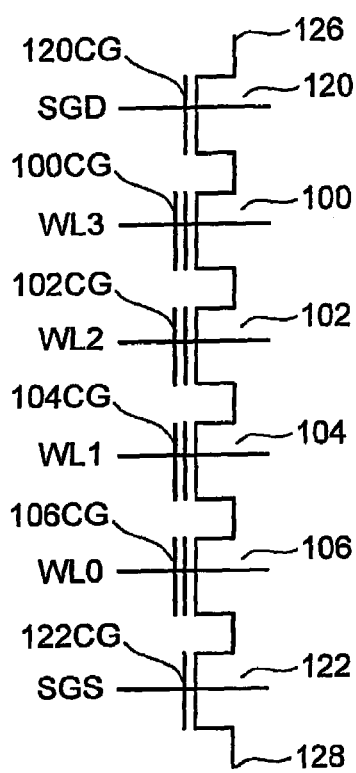
FIG. 2 is an equivalent circuit diagram of the NAND string.
Figure 3:
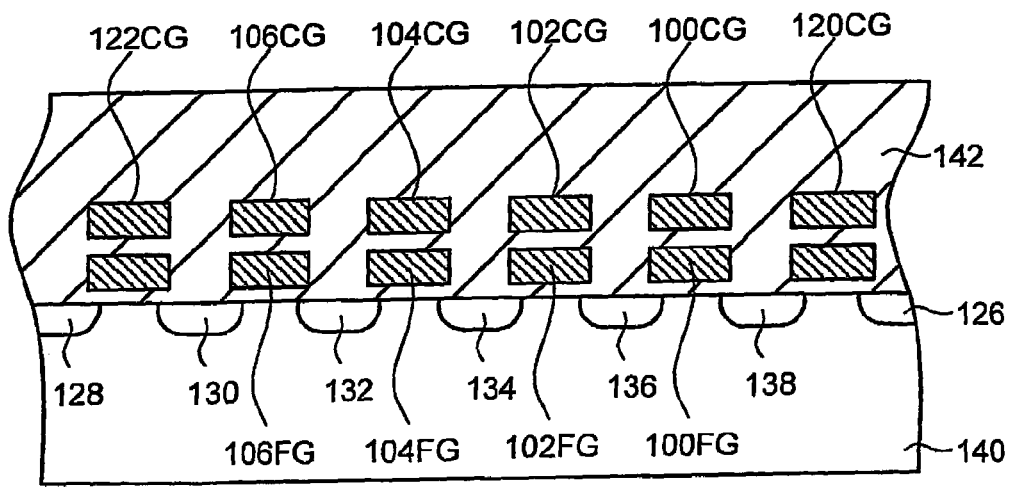
FIG. 3 is a cross sectional view of the NAND string.
Figure 4:
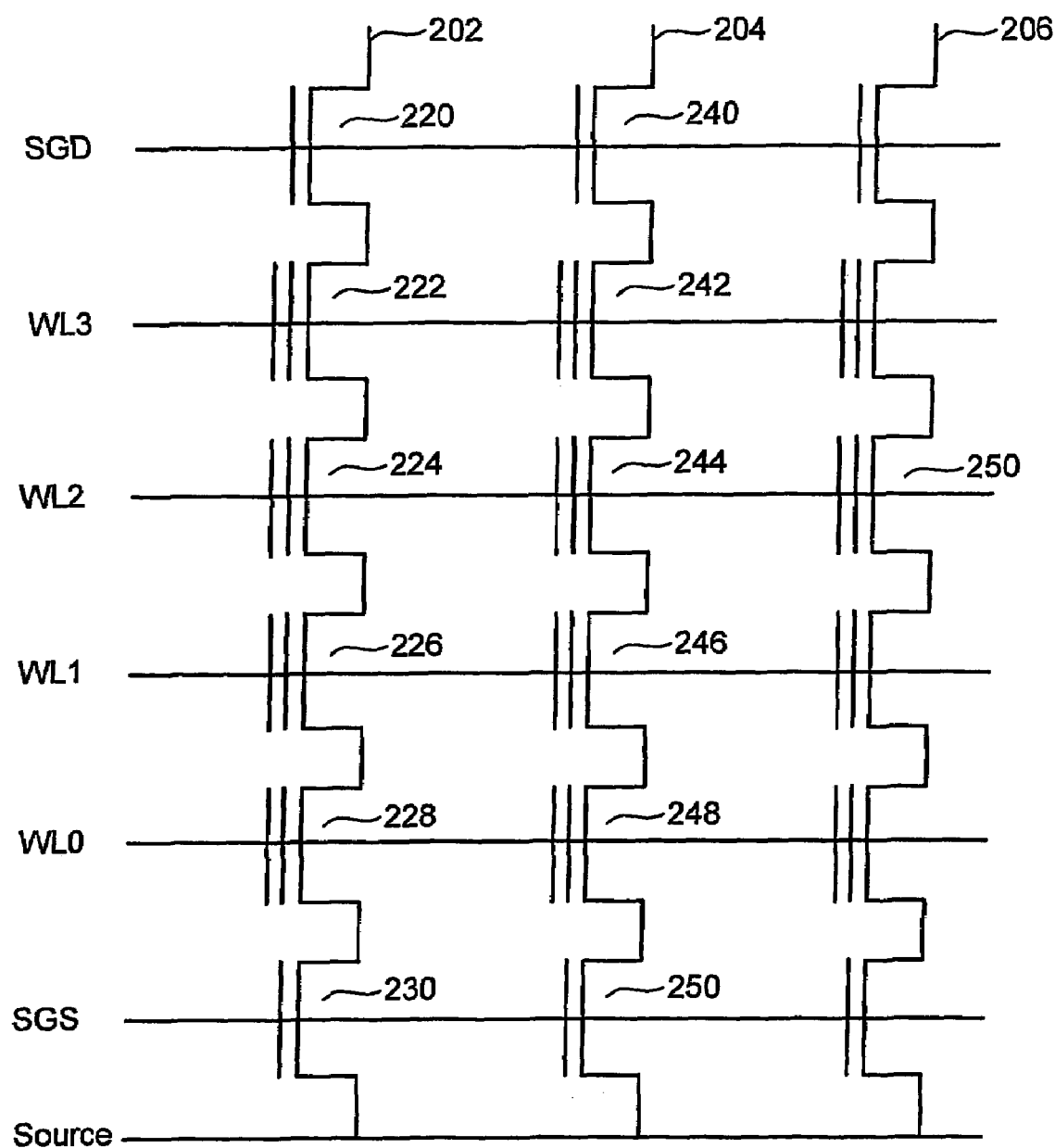
FIG. 4 is a circuit diagram depicting three NAND strings.

Normally, the cells being programmed in parallel are alternate ones along a word line. For example, FIG. 4 illustrates three memory cells 224, 244 and 250 of a much larger number of cells along one word line WL2. One set of alternate cells, including cells 224 and 250, store bits from logical pages 0 and 2 ("even pages"), while another set of alternate cells, including the cell 244, store bits from logical pages 1 and 3 ("odd pages").

Figure 13:
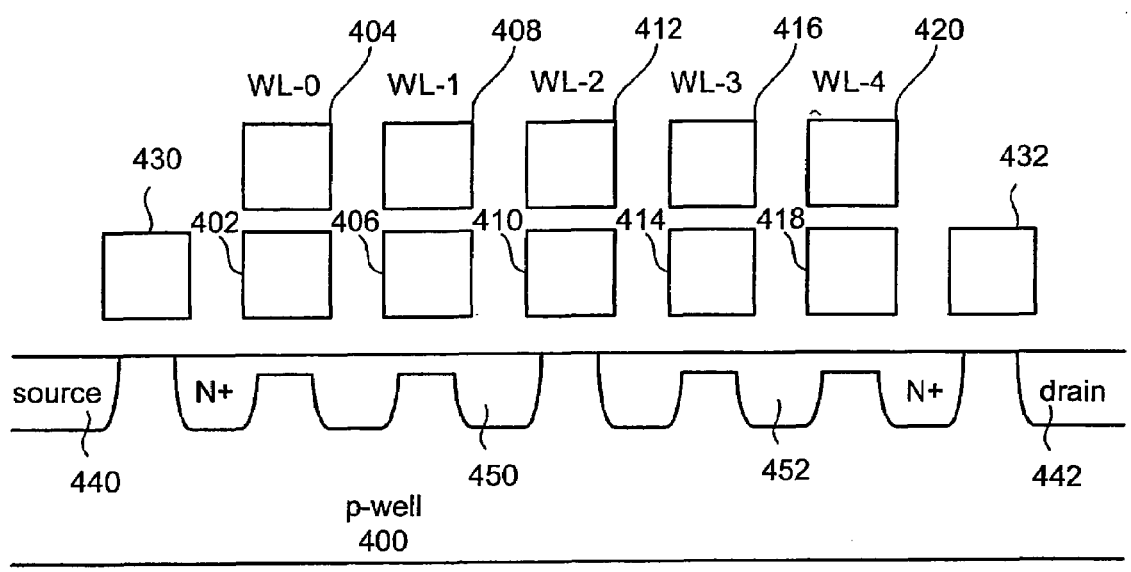
FIG. 13 depicts a cross section of a NAND string.

As described above, each iteration of step 360 includes applying a pulse of Vpgm. More details of step 360 will now be discussed. FIG. 13 depicts a cross-section of a NAND string that is being programmed according to one embodiment of the present invention. For example purposes only, the NAND string in FIG. 13 shows five memory cells connected in series. More or less than five memory cells can be used with the present invention. A first memory cell of the five has a floating gate 402 and control gate 404. A second memory cell has a floating gate 406 and a control gate 408. A third memory cell has a floating gate 410 and a control gate 412. A fourth memory cell has a floating gate 414 and a control gate 416. A fifth memory cell has a floating gate 418 and a control gate 420. The memory cells are on p-well 400. The NAND string is connected to common source line 440 via a select gate having a control gate 430. The NAND string is connected to bit line 442, via a select gate having control gate 432. Each of the control gates are connected to word lines: WL-0 is connected to control gate 404, WL-1 is connected to control gate 408, WL-2 is connected to control gate 412, WL-3 is connected to control gate 416, and WL-4 is connected to control gate 420.

Program step 360 includes two phases. During a first phase, pre-charging is performed. In a second phase, the tunneling of electrons to the floating gate is accomplished. During the second phase, the voltage on the word lines WL-0, WL-1, WL-2, WL-3 and WL-4 are similar to EASB. Assume, for example, that word line WL-3 is connected to the memory cell being programmed and the memory cell being inhibited. Word lines WL-0, WL-1, WL-2 and WL-4 are the unselected word lines. Word line WL-4 is the drain side neighbor word line and word line WL-2 is the source side neighbor to word line. During the second phase, the program voltage Vpgm pulse will be applied to word line WL-3, zero volts will be applied to WL-2 and the Vpass pulse will be applied to word lines WL-0, WL-1, and WL-4. Due to these boosting voltages, the source drains, and channels of neighboring transistors will form one continuous N+ region. For example, there will be a source side channel region 450 and a drain side channel region 452 formed. To prevent GIDL and to keep the source side neighbor cell (e.g. connected to WL-2) off, the present invention includes boosting the voltage potential of the source side channel region 450 in addition to the boosting from driving Vpass on the unselected word lines. This extra boosting is performed during the first phase of the programming process.

Figure 14:
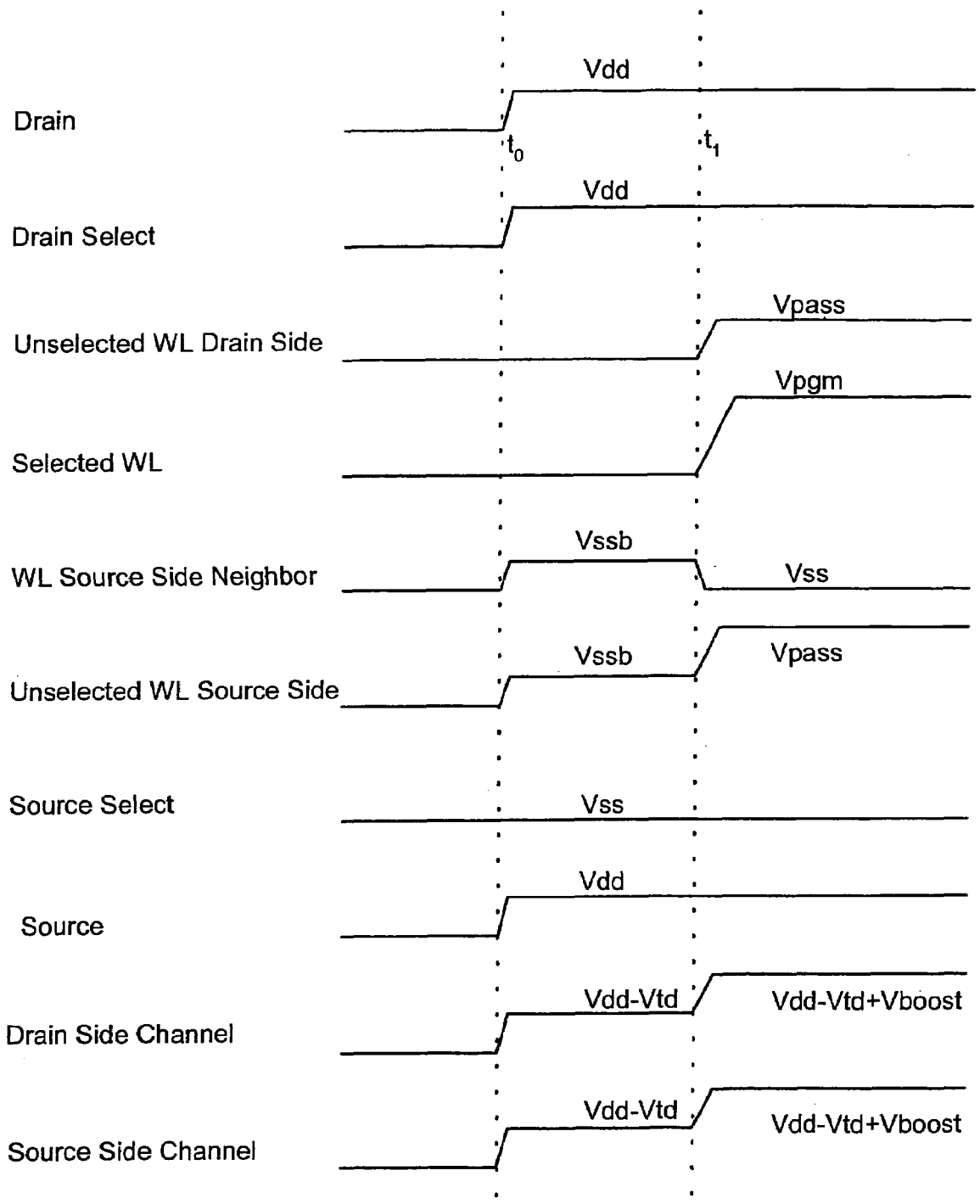
FIGS. 14–18 are timing diagrams that describe multiple embodiments for programming a memory device according to the present invention.

FIG. 14 depicts one embodiment of a method for programming memory cells according to the present invention. At time t0, Vdd, is driven on the drain and on the control gate of the drain select transistor for the NAND string containing the cell to be inhibited. That is, drain/bit line 442 and control gate 432 will both receive Vdd. Also at t0, the source is raised to Vdd, however, the control gate of the source select transistor remains at Vss (zero volts) so the source select transistor is off. Also at time t0, the word line for the source side neighbor of the cell being inhibited is raised to Vssb (e.g. 4 volts). This corresponds to driving Vssb on word line WL-2 in the above example, assuming that word line WL-3 corresponds to the cell being programmed and the cell being inhibited. The other source side word lines that are also driven to Vssb at t0. By driving the source side unselected word lines to Vssb, the source side channel is boosted to a voltage potential of Vdd−Vtd, where Vtd is the threshold voltage of the drain side elect transistor. The drain side channel is at Vdd−Vtd.

At time t1, the program voltage Vpgm (e.g. 20 volts) is driven on the selected word line (e.g. WL-3). The unselected word lines on the drain side (at Vss prior to t1) are driven to Vpass (e.g. the Vpass pulse, which can be up to 7–10 volts). Additionally, the unselected word lines on the source side, except for the source side neighbor word line, are also driven by the Vpass pulse. The drain and drain select are both held at Vdd. The word line for the source side neighbor (e.g. word line WL-2) is lowered to Vss (e.g., 0 volts). The control gate of the source side select line is held at Vss and the source line is held at Vdd. The use of Vpass on the unselected word lines boost the drain side channel to Vdd−Vtd+Vboost (Vtd=threshold voltage of drain side select gate) and the source side channel to Vdd−Vtd+Vboost, where Vboost is due to driving Vpass on the unselected word lines. Note that if the source side channel is not pre-charged or pre-boosted between t0 and t1, then prior to t1 the source side channel would be at zero volts and after t1 it would only have been boosted to Vboost. In some embodiments, Vboost on the source side channel may be different than Vboost on the drain side channel.

Figure 15:
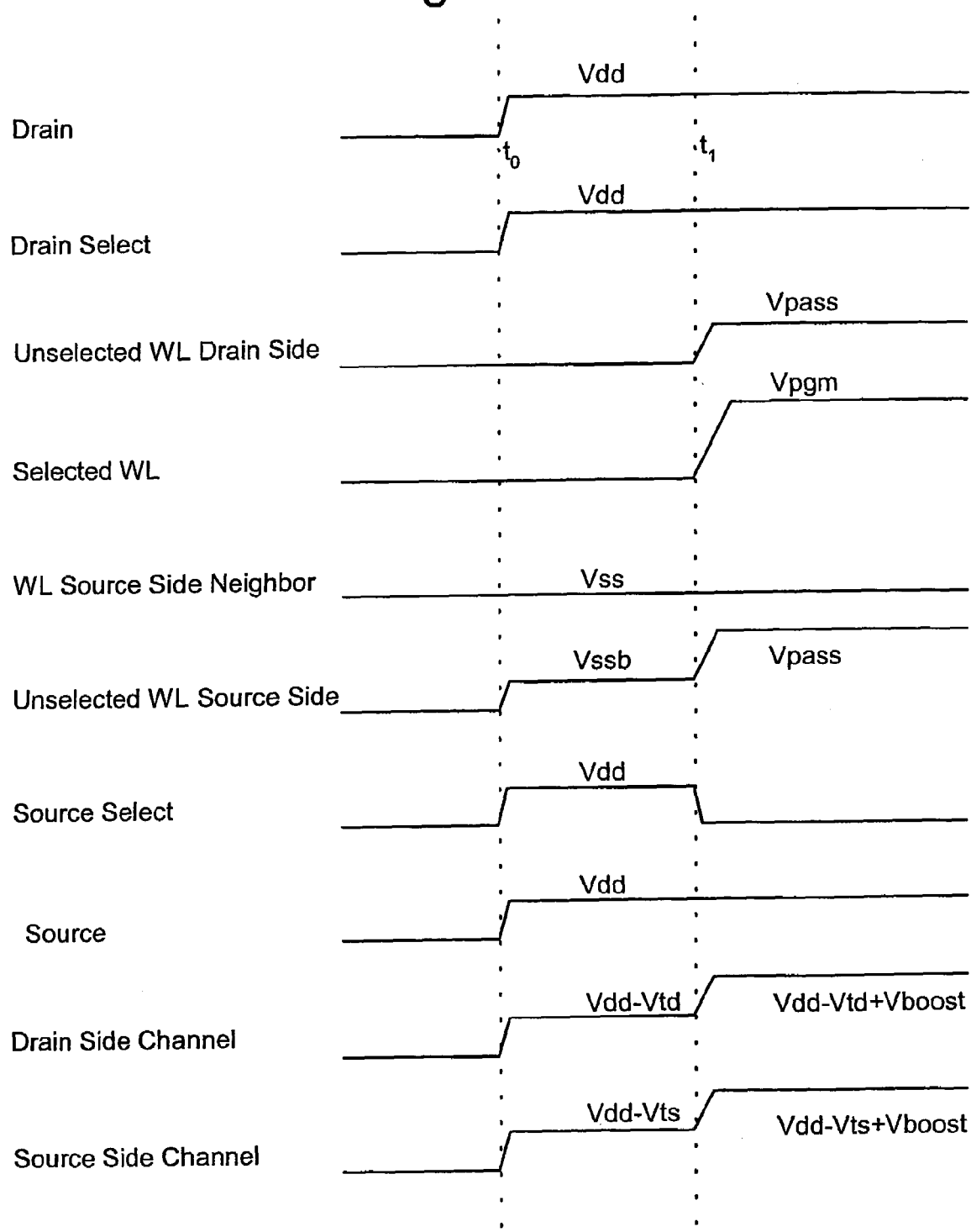

FIG. 15 depicts a second embodiment of a method for programming memory cells according to the present invention. At time t0, the drain voltage (e.g. drain/bit line 442) and drain select control gate (control gate 432) are driven from zero volts to Vdd. The selected word line and the unselected word lines on the drain side are maintained at Vss (e.g. zero volts). The word line for the source side neighbor is kept at Vss; however, the other unselected source side word lines are driven to Vssb. Additionally, the source is driven to Vdd and the control gate of the source side select gate is driven at Vdd (control gate 430). Because the source select gate is turned on, the source is electronically coupled to the string and boosts the voltage potential of source side channel 450. The drain side channel is at a potential of Vdd−Vtd and the source side channel is at a potential of Vdd−Vts, where Vtd is the threshold voltage of the drain side select gate and Vts is the threshold voltage of the source side select gate.

At time t1, the unselected word lines (except for the source side neighbor) are driven to Vpass. For example, WL-0, WL-1 and WL-4 are driven by Vpass. Vpgm is driven on the selected word line WL-3 for the cell being programmed and the cell being inhibited. The word line for the source side neighbor (e.g. WL-2) is maintained at Vss (e.g. 0 volts). Also at time t1, the source side select gate is turned off by making the control gate 430 voltage drop from Vdd to Vss. The pass voltage (Vpass) causes the source side channel 450 to be boosted to Vdd−Vts+Vboost and the drain side channel 452 to be further boosted to Vdd−Vtd+Vboost. Because the source side channel is boosted to a higher voltage potential, many of the performance degradations discussed above are eliminated.

Figure 16:
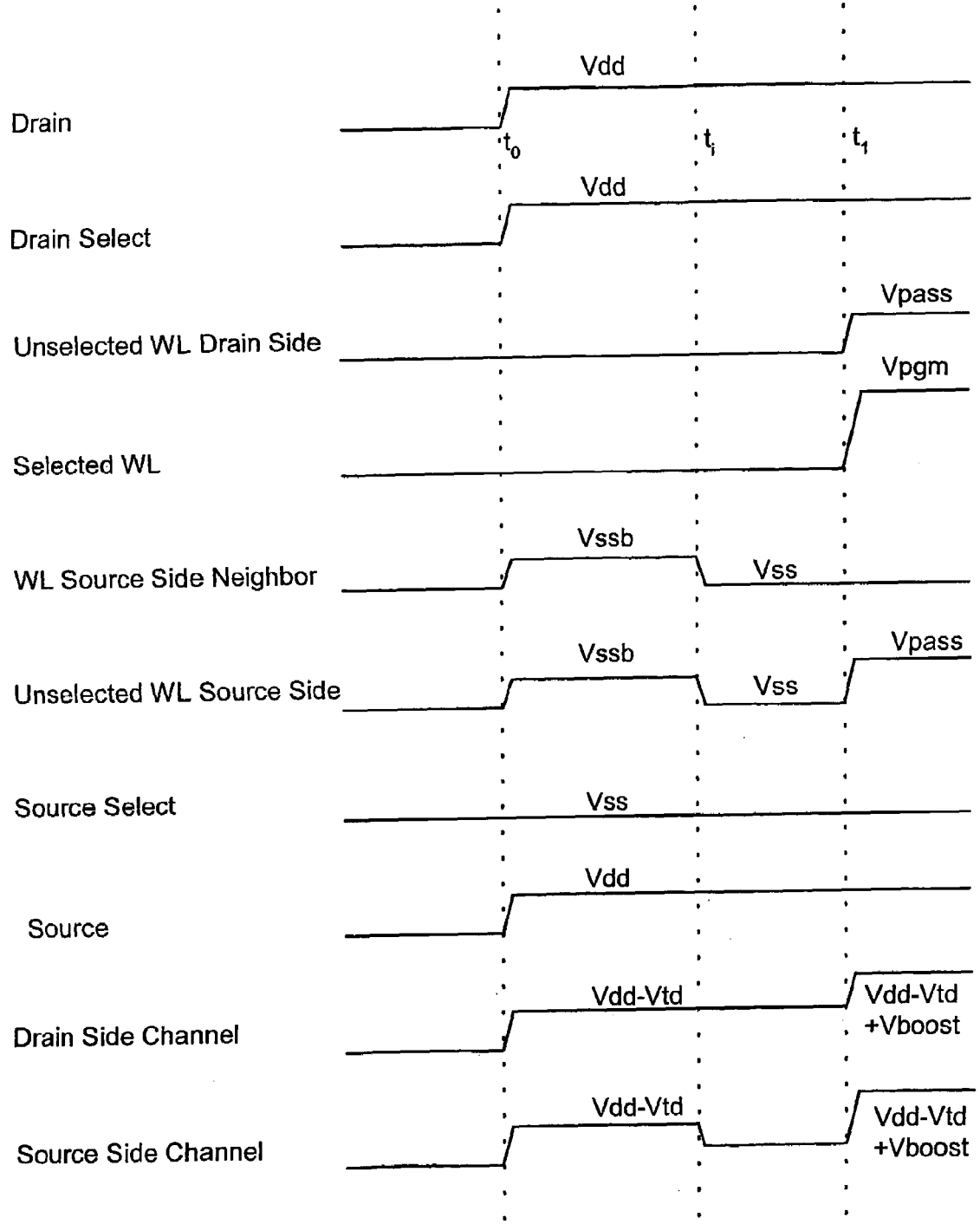

FIG. 16 depicts a third embodiment of a method for programming memory cells according to the present invention. FIG. 16 uses a similar boosting scheme as illustrated in FIG. 14, with some changes as described below. The drain, drain select, unselected drain side word lines, selected word line, source and source select are the same as in FIG. 14. At time t0 of FIG. 16, the source side channel region is charged to Vdd−Vtd by driving Vssb on all of the source side word lines, as done in FIG. 14. In FIG. 14, the extent of the additional source side boosting is determined by the voltage difference between Vpass and Vssb. However, in FIG. 16 the voltage potential on the source side word lines is reduced to 0v at time ti (where ti is after t0 and before t1). The source side word lines (except the source side neighbor) are then ramped to Vpass at time t1. Initially, as the voltage on the source side control gates is decreasing from Vssb to 0V, the source side channel region will remain at Vdd−Vtd as long as the source side transistors remain on (in other words, as long as the voltage on the control gate is above the threshold voltage of the source side transistors, Vtss). As soon as the voltage on the source side control gates is reduced below Vtss, the source side channel will be cut off from the drain side channel. Reducing the voltage on the source side control gates from Vtss to 0v and increasing back to Vtss produces no net change in the source side channel potential. However, the source side channel will now be boosted by the voltage difference between Vpass and Vtss, not Vpass and Vssb. This should result in greater boosting of the source side channel.

Figure 17:
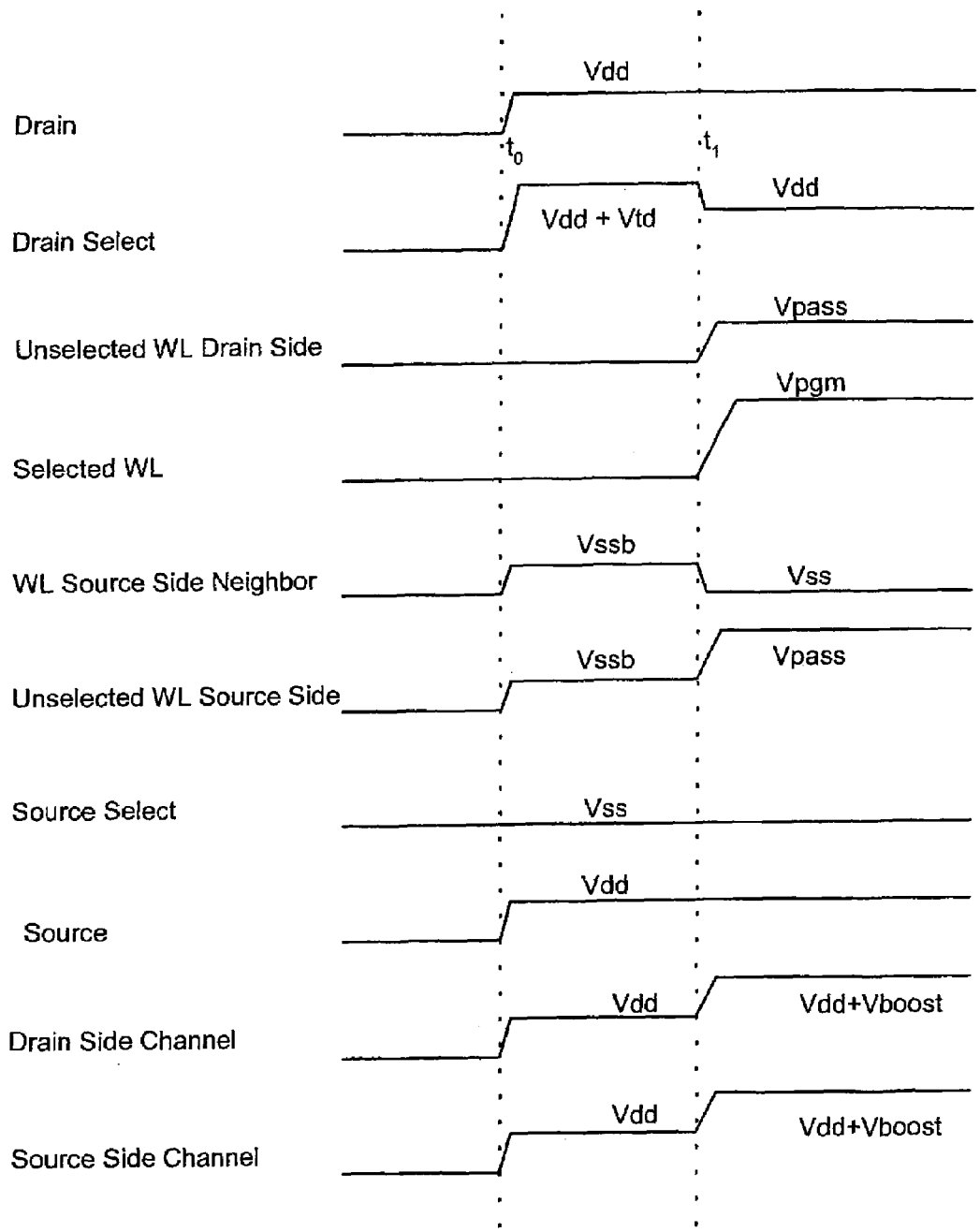

FIG. 17 depicts a fourth embodiment of a method for programming memory cells according to the present invention. FIG. 17 uses a similar boosting scheme as illustrated in FIG. 14; however, the drain select is driven at Vdd+Vtd from t0 to t1 rather than driving the drain select at Vdd. After t1, the drain select is driven at Vdd. Thus, after t1 the drain side channel and the source side channel are at Vdd+Vboost, rather than at Vdd−Vtd+Vboost. In some embodiments, it is easier to increase the drain select rather than the drain. During programming, many bit lines must be selected and the capacitance is large. Only one drain select (or a small number of drain selects) need be selected, thus, the capacitance is relatively small. The timing diagram of FIG. 16 can also be modified as per the teaching of FIG. 17 so that the drain select is driven at Vdd+Vtd rather than driving the drain select at Vdd.

Figure 18:
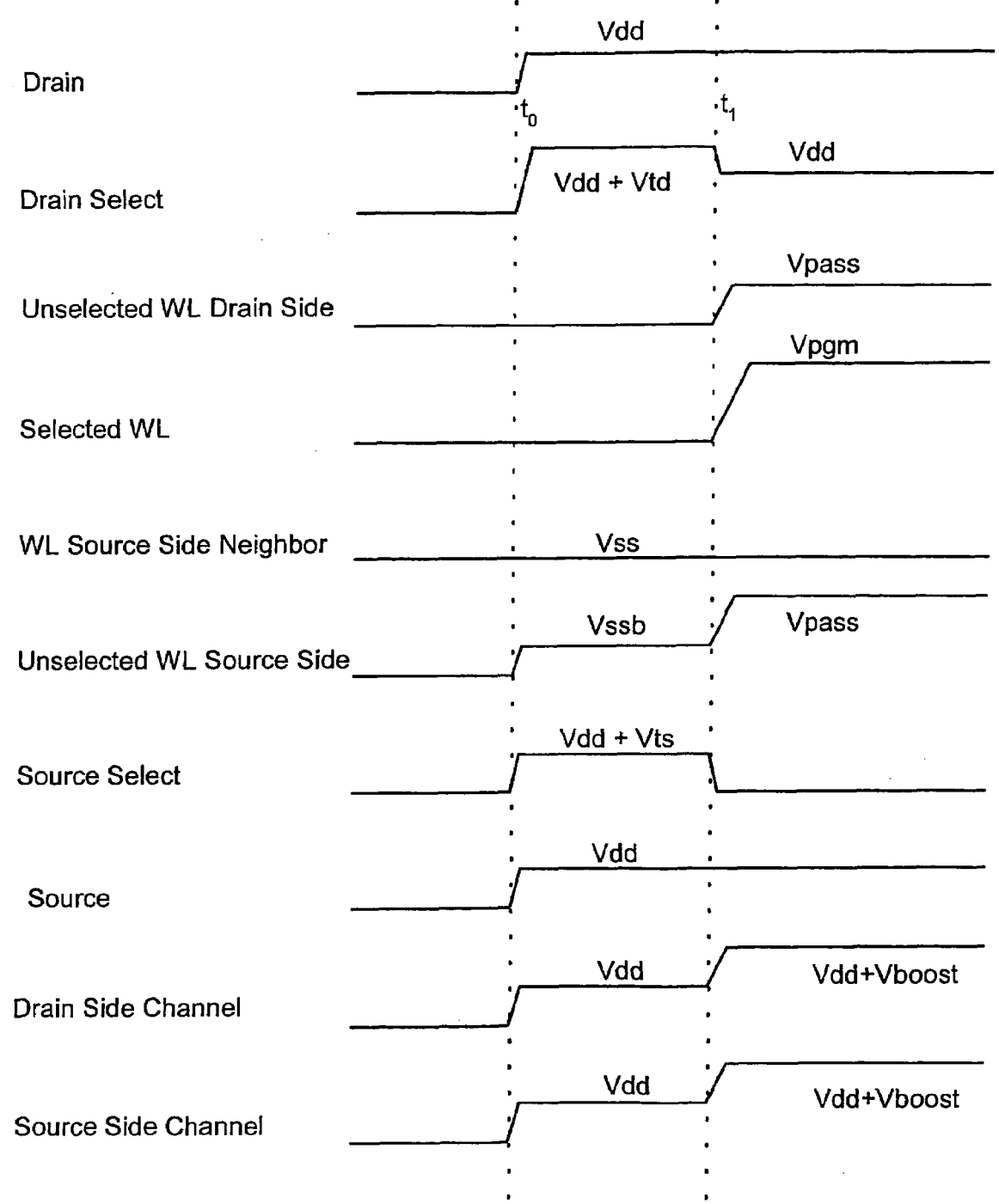

FIG. 18 depicts a fifth embodiment of a method for programming memory cells according to the present invention. FIG. 18 uses a similar boosting scheme as illustrated in FIG. 15; however, the drain select is driven at Vdd+Vtd from t0 to t1 rather than driving the drain select at Vdd. Additionally, the source select is-driven to Vdd+Vts (threshold voltage of the source side select gate) between t0 and t1. After t1 the drain side channel and the source side channel are at Vdd+Vboost.

Although the embodiments above contemplate the use of a stepped pulse, other embodiments can use a constant value for the program voltage Vpgm and/or the pass voltage Vpass. One embodiment uses a stepped pulse for Vpgm and a constant value for Vpass.

An additional advantage of the programming scheme according to the present invention is that soft programming may be eliminated using the present invention. When flash memory cells are erased, the goal is that all erased cells have a negative threshold voltage with a predefined range of negative threshold voltages. However, in practice, the erase process may result in some cells having negative threshold voltage below the predefined range. Memory cells having a threshold voltage that is too low may not subsequently program properly. Thus, some devices will perform what is called a soft program. That is, memory cells with threshold voltages significantly lower values within the predefined range will receive a small amount of programming so that the threshold voltage is raised to be within the predefined range. One reason for the soft program process is that if the threshold voltages of a cell on the source side of the NAND string (with respect to the cell selected for programming) was very negative, then that source side may never turn off, which causes program disturb as described above. However, if the source side channel is boosted according to the present invention, then even the cell with a very negative threshold voltage may still be able to turn off. Thus, one embodiment of the present invention allows a memory cell to be erased and then programmed using the present invention without any soft programming, and without suffering any of the effects of a low negative threshold voltage that is below a predefined range of properly erased memory cells. Eliminating soft programming will increase memory performance as well as eliminating a source of programming errors, namely over-soft programmed cells.

The above examples are provided with respect to NAND type flash memory. However, the principles of the present invention have application to other types of non-volatile memories, including those currently existing and those contemplated to use new technology being developed.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A method of programming a memory system, comprising:
   performing first boosting of a voltage potential of a source side channel region of a first set of non-volatile storage elements which includes, a non-volatile storage element to be inhibited, the first boosting is performed prior to applying a program voltage to the non-volatile storage element to be inhibited and a non-volatile storage element selected for programming, the first boosting comprises applying a first voltage to control gates for a source side neighbor and source side non-neighbors of the non-volatile storage element to be inhibited; and
   performing second boosting of the voltage potential, during the applying of the program voltage, by applying a second voltage, which is greater than the first voltage, to the source side non-neighbors.

2. The method of claim 1, further comprising:
   maintaining the first set of non-volatile storage elements out of communication with a source line during the first boosting.

3. The method of claim 1, further comprising:
   applying a lower voltage than the first voltage to the control gate of the source side neighbor, during the applying of the program voltage.

4. The method of claim 1, further comprising:
   providing zero volts at control gates for drain side unselected non-volatile storage elements in the first set of non-volatile storage elements during the first boosting.

5. The method of claim 1, further comprising:
providing zero volts at a control gate for the non-volatile storage element to be inhibited during the first boosting.

6. A memory system, comprising:
a first set of non-volatile storage elements, which includes a non-volatile storage element selected for programming;
a second set of non-volatile storage elements, which includes a non-volatile storage element to be inhibited, a source side neighbor and source side non-neighbors of the non-volatile storage element to be inhibited; and
one or more managing circuits in communication with the non-volatile storage elements, the one or more managing circuits receive a request to program data, and, responsive to the request: (a) perform first boosting of a voltage potential of a source side channel region of the second set of non-volatile storage elements, the first boosting is performed prior to applying a program voltage to the non-volatile storage element to be inhibited and the non-volatile storage element selected for programming, the first boosting comprises applying a first voltage to control gates for the source side neighbor and the source side non-neighbors, and (b) perform second boosting of the voltage potential, during the applying of the program voltage, by applying a second voltage, which is greater than the first voltage, to the source side non-neighbors.

7. The memory system of claim 6, wherein:
the one or more managing circuits maintain the second set of non-volatile storage elements out of communication with a source line during the first boosting.

8. The memory system of claim 6, wherein:
the one or more managing circuits apply a lower voltage than the first voltage to the control gate of the source side neighbor, during the applying of the program voltage.

9. The memory system of claim 6, further comprising:
a plurality of word lines, including drain side word lines, for providing zero volts at control gates for drain side unselected non-volatile storage elements in the first set of non-volatile storage elements during the first boosting.

10. The memory system of claim 6, wherein:
the one or more managing circuits applies zero volts on a first word line, which is connected to the non-volatile storage element selected for programming and to the non-volatile storage element to be inhibited, during the first boosting.

11. A method of programming a memory system, comprising:
performing first boosting of a voltage potential of a source side channel region of a first set of non-volatile storage elements which includes a non-volatile storage element to be inhibited, the first boosting is performed prior to applying a program voltage to the non-volatile storage element to be inhibited and a non-volatile storage element selected for programming, the first boosting comprises applying a first voltage to control gates for a source side neighbor and source side non-neighbors of the non-volatile storage element to be inhibited;
following the first boosting and preceding the applying of the program voltage, applying a lower voltage than the first voltage to the control gates for the source side non-neighbors; and
performing second boosting of the voltage potential, during the applying of the program voltage, by applying a second voltage, which is greater than the first voltage, to the source side non-neighbors.

12. The method of claim 11, further comprising:
following the first boosting and preceding the applying of the program voltage, applying the lower voltage than the first voltage to the control gate for the source side neighbor.

13. The method of claim 11, further comprising:
maintaining the first set of non-volatile storage elements out of communication with a source line during the first boosting.

14. The method of claim 11, further comprising:
providing zero volts at control gates for drain side unselected non-volatile storage elements in the first set of non-volatile storage elements during the first boosting.

15. A memory system, comprising:
a first set of non-volatile storage elements, which includes a non-volatile storage element selected for programming;
a second set of non-volatile storage elements, which includes a non-volatile storage element to be inhibited, a source side neighbor and source side non-neighbors of the non-volatile storage element to be inhibited; and
one or more managing circuits in communication with the non-volatile storage elements, the one or more managing circuits receive a request to program data, and, responsive to the request: (a) perform first boosting of a voltage potential of a source side channel region of the second set of non-volatile storage elements, the first boosting is performed prior to applying a program voltage to the non-volatile storage element to be inhibited and the non-volatile storage element selected for programming, the first boosting comprises applying a first voltage to control gates for the source side neighbor and the source side non-neighbors, (b) following the first boosting and preceding the applying of the program voltage, apply a lower voltage than the first voltage to the control gates for the source side non-neighbors, and (c) perform second boosting of the voltage potential, during the applying of the program voltage, by applying a second voltage, which is greater than the first voltage, to the source side non-neighbors.

16. The memory system of claim 15, wherein:
following the first boosting and preceding the applying of the program voltage, the one or more managing circuits apply the lower voltage than the first voltage to the control gate for the source side neighbor.

17. The memory system of claim 15, wherein:
the one or more managing circuits maintain the second set of non-volatile storage elements out of communication with a source line during the first boosting.

18. The memory system of claim 15, further comprising:
a plurality of word lines, including drain side word lines, for providing zero volts at control gates for drain side unselected non-volatile storage elements in the second set of non-volatile storage elements during the first boosting.

19. A method of programming a memory system, comprising:
performing first boosting of a voltage potential of a source side channel region of a first set of non-volatile storage elements which includes a non-volatile storage element to be inhibited, the first boosting is performed prior to applying a program voltage to the non-volatile storage element to be inhibited and a non-volatile storage element selected for programming, the first boosting comprises applying a first voltage to control gates for source side non-neighbors of the non-volatile storage element to be inhibited, applying a lower voltage than the first voltage to a control gate of the source side neighbor, and maintaining the first set of non-volatile storage elements in communication with a source line; and performing second boosting of the voltage potential, during the applying of the program voltage, by applying a second voltage, which is greater than the first voltage, to the source side non-neighbors, and maintaining the first set of non-volatile storage elements out of communication with the source line.

20. The method of claim 19, wherein:

the maintaining the first set of non-volatile storage elements out of communication with the source line comprises controlling a voltage provided to a source side select gate associated with the first set of non-volatile storage elements so that the source line is not electrically coupled to the first set of non-volatile storage elements.

21. The method of claim 19, wherein:

the maintaining the first set of non-volatile storage elements in communication with the source line comprises controlling a voltage provided to a source side select gate associated with the first set of non-volatile storage elements so that the source line is electrically coupled to the first set of non-volatile storage elements.

22. The method of claim 21, wherein:

the voltage which is provided to the source side select gate during the first boosting is the same as a voltage on the source line.

23. The method of claim 21, wherein:

the voltage which is provided to the source side select gate during the first boosting is higher than a voltage on the source line.

24. The method of claim 21, wherein:

the voltage which is provided to the source side select gate during the first boosting is higher than a voltage on the source line by Vts, which is a threshold voltage of the source side select gate.

25. The method of claim 19, further comprising:

providing a voltage to a control gate of a drain side select gate associated with the first set of non-volatile storage elements which is higher during the first boosting than during the second boosting.

26. The method of claim 19, further comprising:

providing a voltage to a control gate of a drain side select gate associated with the first set of non-volatile storage elements which is higher during the first boosting than during the second boosting by Vtd, which is a threshold voltage of the drain side select gate.

27. The method of claim 19, further comprising:

providing zero volts at control gates for drain side unselected non-volatile storage elements in the first set of non-volatile storage elements during the first boosting.

28. The method of claim 19, further comprising:

providing zero volts at a control gate for the non-volatile storage element to be inhibited during the first boosting.

29. A memory system, comprising:

a first set of non-volatile storage elements, which includes a non-volatile storage element selected for programming;

a second set of non-volatile storage elements, which includes a non-volatile storage element to be inhibited, a source side neighbor and source side non-neighbors of the non-volatile storage element to be inhibited; and one or more managing circuits in communication with the non-volatile storage elements, the one or more managing circuits receive a request to program data, and, responsive to the request: (a) perform first boosting of a voltage potential of a source side channel region of the second set of non-volatile storage elements, the first boosting is performed prior to applying a program voltage to the non-volatile storage element to be inhibited and the non-volatile storage element selected for programming, the first boosting comprises applying a first voltage to control gates for the source side non-neighbor, applying a lower voltage than the first voltage to a control gate of the source side neighbor, and maintaining the second set of non-volatile storage elements in communication with a source line, and (b) perform second boosting of the voltage potential, during the applying of the program voltage, by applying a second voltage, which is greater than the first voltage, to the source side non-neighbors, and maintaining the second set of non-volatile storage elements out of communication with the source line.

30. The memory system of claim 29, wherein:

the one or more managing circuits maintains the second set of non-volatile storage elements out of communication with the source line by controlling a voltage provided to a source side select gate associated with the second set of non-volatile storage elements so that the source line is not electrically coupled to the second set of non-volatile storage elements.

31. The memory system of claim 29, wherein:

the one or more managing circuits maintains the second set of non-volatile storage elements in communication with the source line by controlling a voltage provided to a source side select gate associated with the second set of non-volatile storage elements so that the source line is electrically coupled to the second set of non-volatile storage elements.

32. The memory system of claim 31, wherein:

the voltage which is provided to the source side select gate during the first boosting is the same as a voltage on the source line.

33. The memory system of claim 31, wherein:

the voltage which is provided to the source side select gate during the first boosting is higher than a voltage on the source line.

34. The memory system of claim 31, wherein:

the voltage which is provided to the source side select gate during the first boosting is higher than the voltage on the source line by Vts, which is a threshold voltage of the source side select gate.

35. The memory system of claim 29, wherein:

the one or more managing circuits provides a voltage to a control gate of a drain side select gate associated with the second set of non-volatile storage elements which is higher during the first boosting than during the second boosting.

36. The memory system of claim 29, wherein:

the one or more managing circuits provides a voltage to a control gate of a drain side select gate associated with the second set of non-volatile storage elements which is higher during the first boosting than during the second boosting by Vtd, which is a threshold voltage of the drain side select gate.

37. The memory system of claim 29, wherein:

the one or more managing circuits provides zero volts at control gates for drain side unselected non-volatile storage elements in the second set of non-volatile storage elements during the first boosting.

38. The memory system of claim 29, wherein:

the one or more managing circuits provides zero volts at a control gate for the non-volatile storage element to be inhibited during the first boosting.

* * * * *